United States Patent
Chu et al.

(10) Patent No.: US 11,116,107 B2
(45) Date of Patent: Sep. 7, 2021

(54) FLEXIBLE SCREEN

(71) Applicant: BOE TECHNOLOGY GROUP CO., LTD., Beijing (CN)

(72) Inventors: Shangchieh Chu, Beijing (CN); Yonghong Zhou, Beijing (CN); Yanyan Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/640,179

(22) PCT Filed: Mar. 5, 2019

(86) PCT No.: PCT/CN2019/076997
§ 371 (c)(1),
(2) Date: Feb. 19, 2020

(87) PCT Pub. No.: WO2020/177078
PCT Pub. Date: Sep. 10, 2020

(65) Prior Publication Data
US 2021/0144881 A1    May 13, 2021

(51) Int. Cl.
*H05K 7/20* (2006.01)
*H05K 5/00* (2006.01)

(52) U.S. Cl.
CPC ......... *H05K 7/2039* (2013.01); *H05K 5/0017* (2013.01)

(58) Field of Classification Search
CPC ............... H05K 7/2039; H05K 5/0017; G02F 1/133385; G02F 1/133382

USPC ............... 361/679.46, 679.54, 704, 705, 706
See application file for complete search history.

(56) References Cited

U.S. PATENT DOCUMENTS

| | | | |
|---|---|---|---|
| 2010/0181890 A1* | 7/2010 | Tseng | H05K 1/021 313/46 |
| 2011/0299248 A1* | 12/2011 | Liu | H05K 7/20436 361/695 |
| 2014/0307396 A1* | 10/2014 | Lee | H05K 1/028 361/749 |
| 2015/0021570 A1* | 1/2015 | Kim | H01L 51/5293 257/40 |
| 2015/0036300 A1* | 2/2015 | Park | G02F 1/1345 361/749 |
| 2017/0042018 A1* | 2/2017 | Long | H05K 9/0032 |
| 2017/0215288 A1* | 7/2017 | Shi | H01L 27/3276 |

(Continued)

OTHER PUBLICATIONS

English Machine Translation of the PCT Search Opinion Submitted to the Office dated Feb. 19, 2020. (Year: 2019).*

*Primary Examiner* — Stephen S Sul
(74) *Attorney, Agent, or Firm* — Armstrong Teasdale LLP

(57) ABSTRACT

The present disclosure relates to a flexible screen, including a display substrate including a first portion, a second portion folded to form an end portion of the flexible screen and a third portion, said first, second, and third portions being sequentially connected, and a support plate for supporting the display substrate, wherein the first portion and the third portion of the display substrate are opposite to each other, the support plate is arranged between the first portion and the third portion of the display substrate, and one end of the support plate faces one surface of the second portion, and wherein the surface of the second portion facing the support plate is provided with an end heat dissipation device.

20 Claims, 4 Drawing Sheets

(56) References Cited

U.S. PATENT DOCUMENTS

| | | | | |
|---|---|---|---|---|
| 2018/0178493 A1* | 6/2018 | Fujioka | ................... | B32B 15/09 |
| 2019/0223332 A1* | 7/2019 | Cheng | ............... | G02F 1/133382 |
| 2019/0355927 A1* | 11/2019 | Park | .................... | H01L 51/5246 |
| 2019/0393433 A1* | 12/2019 | Dagn | ................... | H01L 51/529 |
| 2020/0136085 A1* | 4/2020 | Wang | ................... | H05K 5/0017 |
| 2020/0144559 A1* | 5/2020 | Zhang | ................ | H01L 51/5246 |
| 2020/0152895 A1* | 5/2020 | Zhu | .................... | H01L 51/0097 |
| 2020/0154581 A1* | 5/2020 | Chen | .................. | H01L 51/5246 |
| 2020/0266368 A1* | 8/2020 | Park | ..................... | H01L 27/323 |

\* cited by examiner

FLEXIBLE SCREEN

CROSS REFERENCE TO RELATED APPLICATIONS

This patent application is a National Stage Entry of PCT/CN2019/076997 filed on Mar. 5, 2019, the disclosure of which is incorporated by reference herein in its entirety as part of the present application.

BACKGROUND

The present disclosure relates to the field of flexible screens.

In the fields of smart phones, liquid crystal televisions and computer displays, people are seeking for a full screen display with a super-high screen-to-body ratio, and flexible screens are widely used. In order to achieve a better full screen display effect, a flexible screen is usually folded. Specifically, a display substrate of the flexible screen is folded onto a back thereof so as to reduce a width of a frame of the flexible screen and thus to increase the screen-to-body ratio.

BRIEF DESCRIPTION

The present disclosure relates to a flexible screen, including a display substrate, the display substrate including a first part, a second part, and a third part which are connected in sequence, said second part being folded to form an end part of the flexible screen, and a support plate for supporting the display substrate, wherein the first part and the third part of the display substrate are opposite to each other, the support plate is between the first part and the third part of the display substrate and one end of the support plate faces one surface of the second part, and wherein an end heat dissipation device is provided on a surface of the second part facing one side of the support plate.

In one embodiment, the flexible screen may further include at least one heat dissipation film, wherein the heat dissipation film is on a surface of the first part and/or the third part facing the support plate. The heat dissipation film further improves the heat dissipation of the whole flexible screen.

In one embodiment, the first part may be a display area for displaying, and the third part may be a non-display area for carrying electronic components. Alternatively, the third part may be a display area for displaying, and the first part may be a non-display area for carrying electronic components.

In one embodiment, the end heat dissipation device may be a heat dissipation silica gel. Heat generated by the second part may be advantageously conducted out by the heat dissipation silica gel.

The heat dissipation silica gel may have a conformal shape to that of the surface of the second part of the display substrate facing the support plate, which enables the heat dissipation silica gel to snugly abut the surface of the second part of the display substrate facing the support plate, thus the heat generated by the second part can be conducted out more quickly and effectively.

The heat dissipation silica gel may contact the support plate and is pressed by the end of the support plate to abut the surface of the second part of the display substrate. With this configuration, the support plate may be pressed an end of the heat dissipation silica gel with a pre-stress on the surface of the second part, further ensuring that the heat dissipation silica gel full abuts the second part.

In one embodiment, the end heat dissipation device may be a heat dissipation film on the surface of the second part facing the support plate, the heat dissipation film can advantageously transfer heat out.

The flexible screen may further include a pressing block, wherein the pressing block contacts the heat dissipation film at the second part of the display substrate to apply a force to the heat dissipation film so as to press the latter on the second part; whether or not the third part is provided with a heat dissipation film, the pressing block can always ensure sufficient and effective contacting between the heat dissipation film and the second part.

The pressing block may be fixed on the support plate, so the support plate can provide the pressing block with a force for acting on the heat dissipation film, which facilitates effective contacting between the heat dissipation film and the second part.

The pressing block may be an elastic pressing block, and the elastic pressing block can provide a pre-stress so as to ensure sufficient contacting between the heat dissipation film and the second part.

The heat dissipation film may be formed of artificial graphite, natural graphite, graphene, nano-carbon, copper foil, heat-conducting silica gel, or a composite material of the materials selected from artificial graphite, natural graphite, graphene, nano-carbon, copper foil, and heat-conducting silica gel. The material chosen for the heat dissipation film shall ensure a good thermal conductivity so as to facilitate the heat dissipation of the whole flexible screen.

In one embodiment, the heat dissipation film on the second part may be smoothly connected with the heat dissipation film(s) on the first part and/or the third part. The smooth connection leads to a gapless heat dissipation system on the second part and the first part and/or the third part, which ensures a sufficient and effective heat dissipation.

The heat dissipation film on the second part and the heat dissipation film(s) on the first part and/or the third part may be formed of a single material, and thus the heat dissipation is efficient, and manufacturing is easier.

The support plate is a single-layer material plate. With good heat dissipation of the second part and the third part, the support plate can be made with less material, and the thickness of the flexible screen can be reduced by selecting a single layer of material, which leads to a lighter flexible screen.

DETAILED DESCRIPTION

Figure 1:
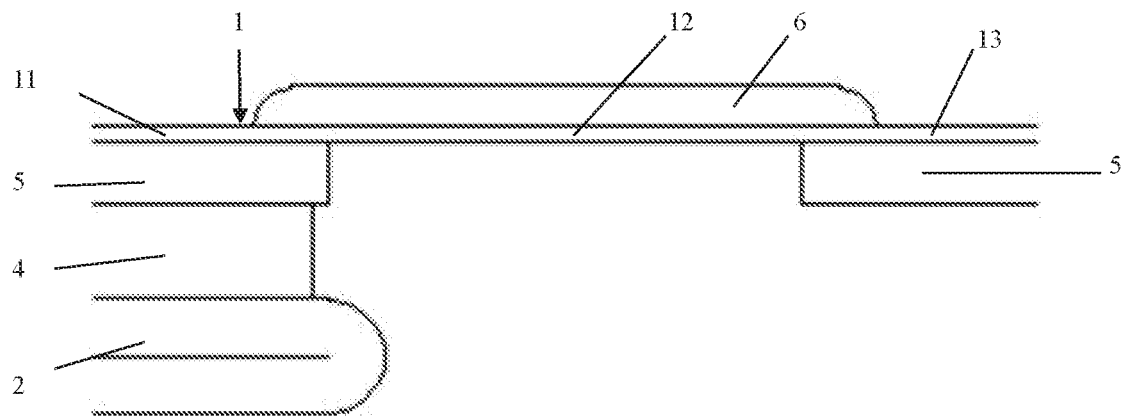
FIG. 1 is a schematic structural diagram of a display substrate of a currently existing flexible screen before folding, wherein a back film of a bending area is removed so as to enable folding.
Figure 2:
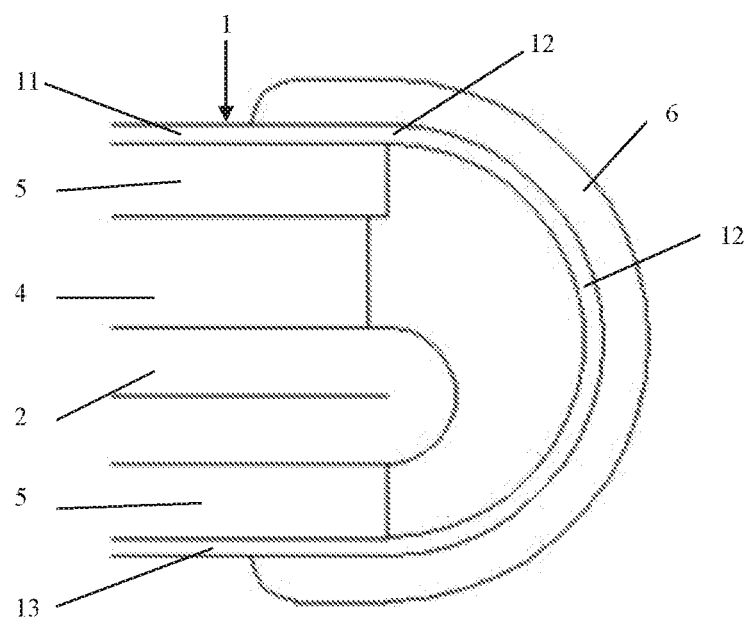
FIG. 2 is a schematic structural diagram of the display substrate of the currently existing flexible screen after folding.

FIGS. 1 and 2 show schematic structural diagrams of flexible screens used in the prior art. As shown in the Figures, the display screen includes a display substrate 1, wherein the display substrate 1 includes a first portion 11 (display area) for displaying images, a second portion 12 (bending area) for folding the display substrate 1 so as to form an end portion of the display screen, and a third portion 13 (non-display area) for carrying electronic components such as a display driving circuit and a flexible circuit board, said first, second and third portions being sequentially connected. In the manufacturing process of the display substrate 1, a back film 5 is bonded to a back surface of the display substrate 1 in order to keep the display substrate 1 flat. When folding the display substrate 1 in the manufacturing process of the display screen, it is necessary to remove the back film on the back surface of the second portion 12 to perform folding. After folding, as shown in FIG. 2, the first portion 11 and the third portion 13 are opposite to each other. In the manufacturing process of the display screen, a support plate 2 as shown is provided to support the display substrate of the whole display screen. The support plate 2 is arranged between the first portion 11 and the third portion 13 of the display substrate 1. A resin adhesive 6 is provided on the outer side of the flexible screen formed by the second portion 12, the resin adhesive protects the bending area from breakage.

As to the heat dissipation structure in the existing flexible screen, a heat dissipation film 4 is usually provided only on one side of the support plate 2 close to the first portion 11 in order to dissipate heat from the display screen, as shown in FIGS. 1 and 2. The heat dissipation film 4 is generally disposed adjacent to a back film 5 on the back side of the first portion 11 and contacts the support plate 2. The support plate 2 is usually made of metal, which facilitates the conduction of heat from the first portion 11 through the heat dissipation film 4, the support plate 2 and so on, thereby dissipating heat. Generally, there is no heat dissipation film provided on the second portion 12 and the third portion 13 of the display substrate 1, thus it is difficult for the heat in the second portion 12 and the third portion 13 to be conducted out, especially for the bending area, in which the problem of heat concentration often occurs. A portion of the second portion 12 and of the third portion 13 are in contact with the support plate 2, thus some of the heat can be conducted out through the support plate 2. In this case, the support plate 2 is generally configured to be a double-layers plate, which increases the overall thickness of the flexible screen, and the problem of heat concentration in the second portion 12 and the third portion 13 has not been fundamentally solved.

In order to improve the heat dissipation of the flexible screen and give consideration to the supporting protection for the flexible screen, the present disclosure proposes a flexible screen, which can overcome the defect of insufficient heat dissipation of the flexible screen in the prior art by adding a heat dissipation device in the bending area of the display substrate 1.

Figure 3:
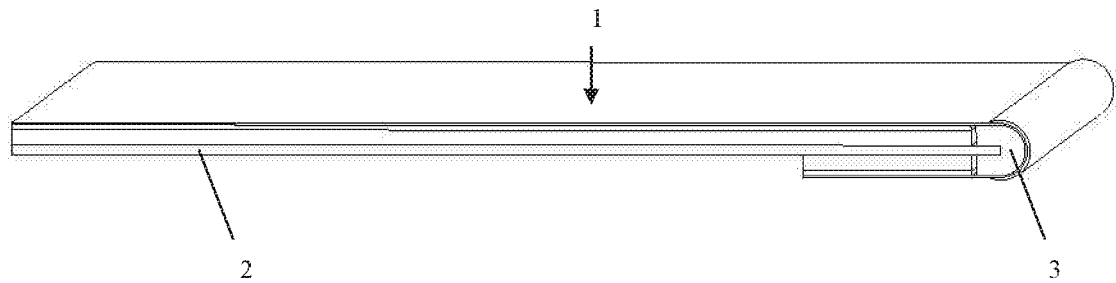
FIG. 3 is a perspective view of a flexible screen according to a first embodiment of the present disclosure.
Figure 4:
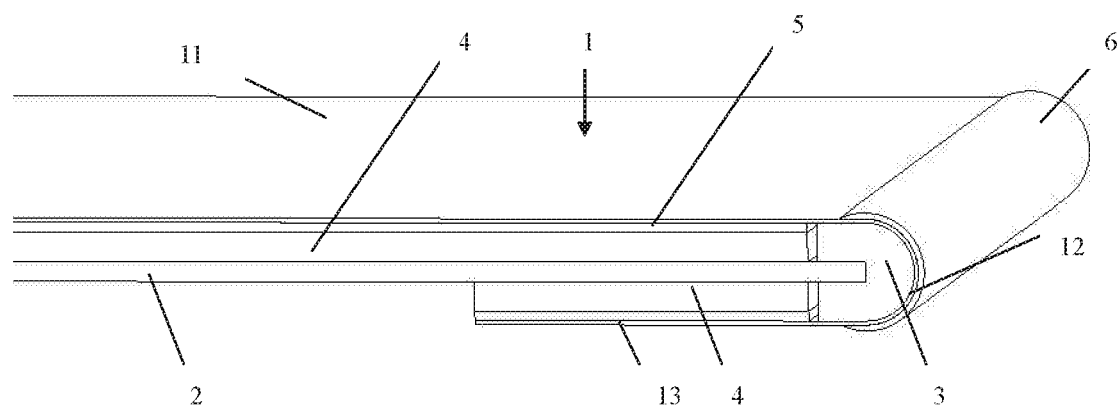
FIG. 4 is an enlarged view of an end portion of the flexible screen according to the first embodiment of the present disclosure.
Figure 5:
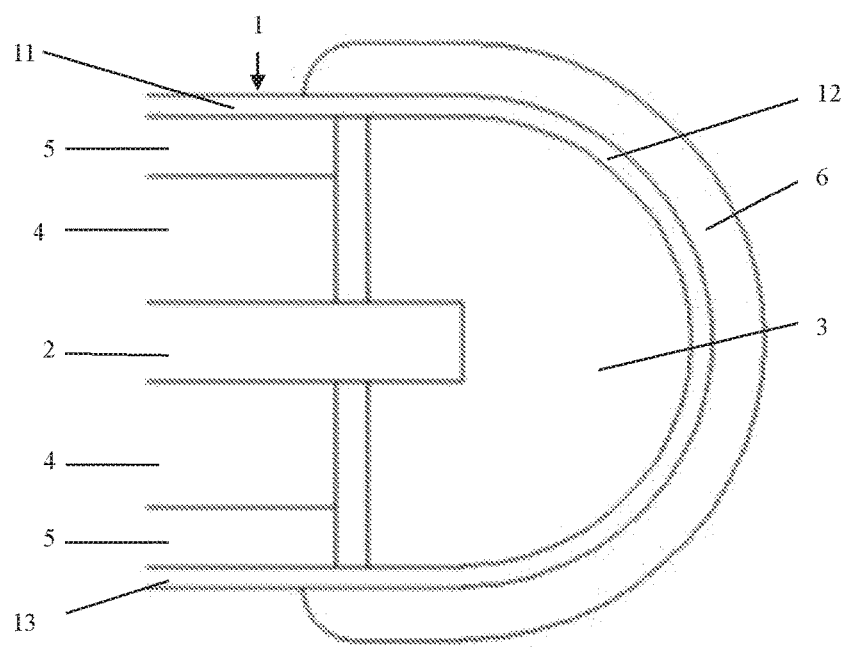
FIG. 5 is a sectional view of the end portion of the flexible screen according to the first embodiment of the present disclosure, wherein the end heat dissipation device is the heat dissipation silica gel arranged on a bending area of the display substrate.
Figure 6:
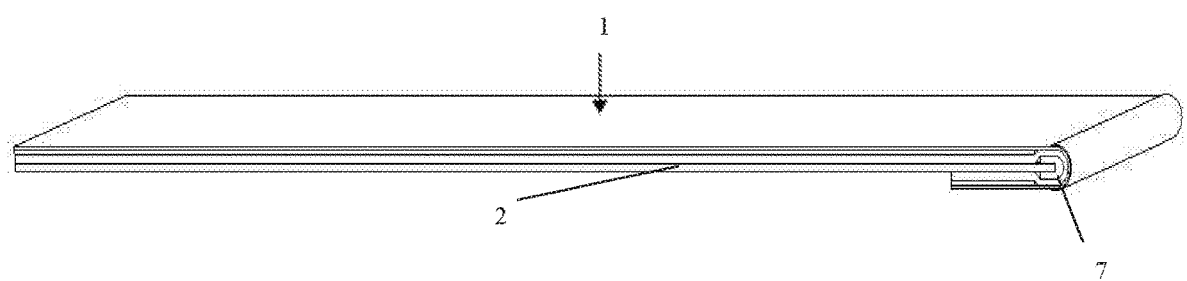
FIG. 6 is a perspective view of a flexible screen according to a second embodiment of the present disclosure.
Figure 7:
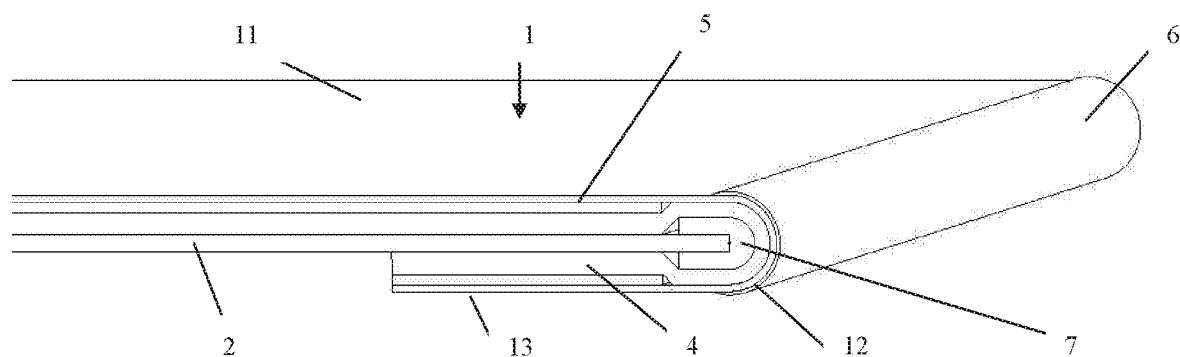
FIG. 7 is an enlarged view of an end portion of the flexible screen according to the second embodiment of the present disclosure.
Figure 8:
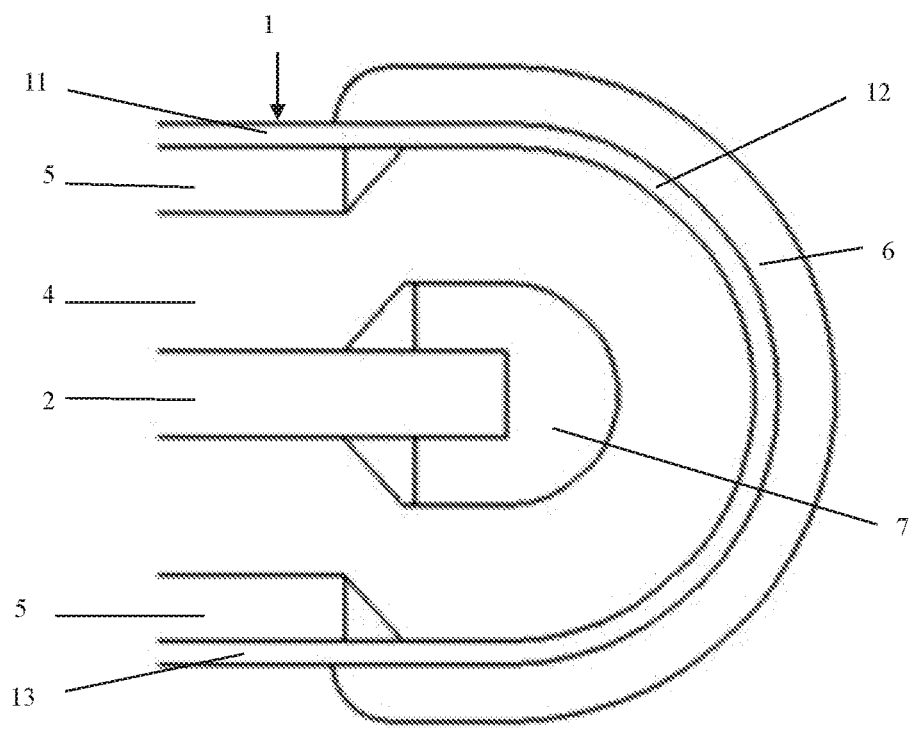
FIG. 8 is a sectional view of the end portion of the flexible screen according to the second embodiment of the present disclosure, wherein the end heat dissipation device is a heat dissipation film arranged on a bending area of the display substrate, and the heat dissipation film arranged on the bending area, the heat dissipation film on the display area and the heat dissipation film on the non-display area are formed of a single material.

FIGS. 3 to 8 show a flexible screen according to the present disclosure, and FIGS. 3 to 5 show a flexible screen according to a first embodiment of the present disclosure, wherein an end heat dissipation device in the form of heat dissipation silica gel is provided. FIGS. 6 to 8 show a flexible screen according to a second embodiment of the present disclosure, wherein an end heat dissipation device in the form of a heat dissipation film is provided. Like the flexible screen shown in FIGS. 1 to 2, the display substrate 1 includes a first portion 11, a second portion 12 for bending the display substrate so as to form a flexible screen end portion, and a third portion 13, wherein said first, second and third portions being sequentially connected. Specifically, the first portion 11 is a display area for displaying, and the third portion 13 is a non-display area for carrying electronic components. Before folding, the first portion 11, the second portion 12, and the third portion 13 are on the same plane, and are each provided with a back film 5 on the back surface thereof so as to make the display substrate 1 flat. When the flexible screen is to be folded, the back film on the second portion 12 is removed and the second portion is bended so that the first portion 11 and the third portion 13 of the display substrate 1 are arranged opposite to each other after folding. A support plate 2 is disposed between the first portion 11 and the third portion 13 to provide a support for the whole display substrate 1. In addition to providing a heat dissipation structure in the form of a heat dissipation film 4 on the back side of the first portion 11 similarly to the prior art, the flexible screen of the present disclosure is particularly provided with a heat dissipation device on the second portion 12 to be folded, which effectively improves heat dissipation of the flexible screen. In an embodiment, a heat dissipation device is provided on a surface of the second portion 12 of the display substrate 1 facing the support plate 2. In an example embodiment, a heat dissipation device is provided on each of the surfaces of the first portion 11 and the second portion 12 of the display substrate 1 facing the support plate 2. In another example embodiment, a heat dissipation device is provided on each of the surfaces of the first portion 11, the second portion 12, and the third portion 13 of the display substrate 1 facing the support plate 2.

In the embodiments shown in FIGS. 3 to 8, the heat dissipation device for the third portion 13 is a heat dissipation film 4, which is identical to the heat dissipation device of the first portion 11. This brings the advantage that, in addition to good heat dissipation obtained for the third portion 13, a symmetrical structure is formed on both sides of the support plate 2. This symmetrical structure facilitates the arrangement and positioning of the end heat dissipation device.

In particular, in one embodiment, the third portion 13 functioning as a non-display area may also take a conventional configuration in which no heat dissipation film is provided, and only an end heat dissipation device is provided at the second portion 12 which forms the end portion of the display screen.

In the first embodiment shown in FIGS. 3 to 5, an end heat dissipation device is provided on the surface of the second portion 12 facing the support plate 2, wherein the end heat dissipation device may be a heat dissipation silica gel 3, which is pressed onto the second portion 12 of the display substrate so to be in close contact with the second portion 12 of the display substrate. FIG. 5 particularly shows an enlarged structural view of the end heat dissipation device in the form of heat dissipation silica gel 3. The heat dissipation silica gel 3 is in contact with the support plate 2 and is pressed into the second portion 12 by the support plate 2. In one embodiment, the heat dissipation silica gel 3 may be fixed to the support plate 2. Alternatively, it is conceivable that the heat dissipation silica gel 3 may be simply covered onto the support plate 2 without being fixed. The heat dissipation silica gel 3 absorbs heat from the second portion 12 by contacting the second portion 12, and transfers heat to the support plate 2 by contact with the support plate 2, which is optionally made of metal, thereby accelerating heat dissipation. Since the heat dissipation silica gel 3 has certain elasticity, the heat dissipation silica gel 3 may be pressed into the bending area 12 of the display substrate 1 with a certain amount of compression, thereby ensuring close contact between the heat dissipation silica gel 3 and the bending area 12 and facilitating the heat dissipation of the bending area 12. In order for the heat dissipation silica gel 3 to have a certain amount of compression, the thickness of the heat dissipation silica gel 3 shall be larger than a sum of the thickness of the support plate 2, of the heat dissipation film 4 arranged on the first portion 11 (and of the heat dissipation film 4 arranged on the third portion 13, if there is any heat dissipation film 4 arranged on the third portion 13), and of the back films 5 provided at both the first portion 11 and the third portion 13. That is, the thickness of the heat dissipation silica gel 3 shall be larger than that of an arc segment formed the second portion 12 of the display substrate 1 facing the support plate 2.

In order to ensure good contact between the heat dissipation silica gel 3 and the second portion 12, the heat dissipation silica gel 3 contacts the second portion 12 of the display substrate 1 with a shape corresponding to the bending shape of the second portion 12. That is, the shape of the heat dissipation silica gel is conformal (i.e. complementary) to that of the surface of the second portion of the display substrate facing the support plate. In other words, the heat dissipation silica gel 3 is arc-shaped corresponding to the arc segment of the second portion 12, thus the heat dissipation silica gel 3 can snugly abut on the bending area 12 well and heat dissipation is ensured.

It is conceivable that any material suitable for heat dissipation other than the heat dissipation silica gel mentioned above may be used for manufacturing the end heat dissipation device according to the present disclosure. Optionally, the material suitable for heat dissipation may have a certain elasticity. When the heat dissipation material has a certain elasticity, the thickness of the heat dissipation material 3 shall be larger than a sum of the thickness of the support plate 2, of the heat dissipation film 4 arranged on the first portion 11 (and of the heat dissipation film 4 arranged on the third portion 13, if there is any heat dissipation film 4 arranged on the third portion 13), and of the back films 5 provided at both the first portion 11 and the third portion 13. However, in some embodiments, when the heat dissipation material does not have elasticity, the thickness of the heat dissipation material 3 shall be equal to a sum of the thickness of the support plate 2, of the heat dissipation film 4 arranged on the first portion 11 (and of the heat dissipation film 4 arranged on the third portion 13, if there is any heat dissipation film 4 arranged on the third portion 13), and of the back film 5 provided at both the first portion 11 and the third portion 13.

In the embodiment shown in FIGS. 6-8, the end heat dissipation device may be a heat dissipation film 4, which is pressed onto the second portion 12 of the display substrate 1. As can be seen from FIGS. 6-8, in the case where the heat dissipation films are provided on both the first portion 11 and the third portion 13, a heat dissipation film 4 functioning as the end heat dissipation device is connected to the heat dissipation films 4 provided on both the first portion 11 and the third portion 13 on either side of the support plate 2. More specifically, the heat dissipation film 4 functioning as the end heat dissipation device is smoothly connected to the heat dissipation films 4 provided on both the first portion 11 and the third portion 13 on both sides of the support plate 2. Still more specifically, during the manufacturing process, the heat dissipation films 4 for the display substrate 1 are formed of a whole piece of heat dissipation film, that is, all the heat dissipation films 4 are made of a single material. More particularly, all the heat dissipation films 4 are formed of a single piece of heat dissipation film, which functions as the heat dissipation device contacting the first portion 11, the second portion 12 and the third portion 13 of the display substrate 1 respectively, thus making the arrangement and positioning of the heat dissipation devices easier. In an embodiment not shown, in the case where only the first portion 11 or the third portion 13 is provided with a heat dissipation film, the heat dissipation film 4 functioning as the end heat dissipation device may be connected to the said heat dissipation film provided on either the first portion or the third portion, or may be in the form of a single piece of heat dissipation film. Alternatively, it is conceivable that the heat dissipation films on the first portion 11, the second portion 12, and the third portion 13 are not connected to each other, but with gaps therebetween.

In the example shown in the drawings, the heat dissipation films 4 provided on the first portion 11, the second portion 12, and the third portion 13 have the same thickness. alternatively, it is conceivable that in some embodiments not shown, the heat dissipation films 4 located at different positions may have different characteristics and parameters, e.g. their thickness or the materials from which they are formed, which may facilitates heat dissipation in some circumstances. In this case, the heat dissipation films 4 constituting the entire heat dissipation structure consist of two or three pieces of heat dissipation film with different parameters which are connected to each other. In an embodiment not shown, there is no heat dissipation film provided on the third portion 13, and the heat dissipation film 4 functioning as the end heat dissipation device is connected to the heat dissipation film on the first portion 11, while all the heat dissipation films 4 are made of a single material, that is, they are formed of a single piece of heat dissipation film. Consequently, the heat dissipation device, which is a whole piece of heat dissipation film, is in contact with the first portion 11 and the second portion of the display substrate 1, respectively. Also as described above, the heat dissipation films 4 located at different portions may have same parameter or different parameters.

In the embodiments of the present disclosure, the heat dissipation film may be formed of any of the following materials: artificial graphite, natural graphite, graphene, nano-carbon, copper foil, heat-conducting silica gel or a composite material of the materials selected from artificial graphite, natural graphite, graphene, nano-carbon, copper foil, and heat-conducting silica gel. Alternatively, the heat dissipation film may be made of any other material, as long as that material can provide good thermal conductivity to facilitate the heat dissipation of the whole flexible screen.

Optionally, the heat dissipation structure may further include a pressing block 7, which contacts the heat dissipation film 4 at the second portion 12 of the display substrate 1 to apply a force to the heat dissipation film 4 so that the heat dissipation film 4 is pressed onto the surface of the second portion 12. The pressing block 7 is fixed at the end of the support plate 2. Optionally, the pressing block 7 may be an elastic pressing block, which elastically presses the heat dissipation film 4 onto the inner surface of the second portion 12 of the display substrate 1 with a certain amount of compression, to ensure a good contact between the heat dissipation film 4 and the second portion 12 of the display substrate 1, and thus a good heat dissipation. As shown in FIG. 4, the pressing block 7 has a symmetrical structure with regard to the support plate 2. Specifically, the pressing block 7 may be made of a foam rubber, which has a certain elasticity, so as to press the heat dissipation film 4 onto the display substrate 1 with a certain amount of compression. Alternatively, it is conceivable that the elastic pressing block 7 may be made of any other elastic materials than foam rubber, such as rubber, elastomer materials, etc. In order for the elastic pressing block to have a certain amount of compression, the thickness of the elastic pressing block shall be larger than that of an arc segment formed by the heat dissipation film 4 provided on the second portion 12 facing the support plate 2. In the case where the heat dissipation films 4 are provided on both the first portion 11 and the third portion 13, the thickness of the elastic pressing block shall be larger than a sum of the thickness of the back films 5 on both the first portion 11 and the third portion 13.

Alternatively, in some embodiments, the pressing block 7 may be inelastic. In this case, the thickness of the pressing block shall be equal to that of an arc segment formed by the heat dissipation film 4 provided on the second portion 12 facing the support plate 2. When heat dissipation films 4 are provided on both the first portion 11 and the third portion 13, the thickness of the pressing block shall be equal to a sum of the thickness of the back films 5 on both the first portion 11 and the third portion 13. In these embodiments, the thickness of the pressing block shall be equal to a sum of the thickness of the back films 5 on both sides of the first portion 11 and the third portion 13.

Like the embodiment shown in FIG. 3, the pressing block 7 shall have a shape corresponding to that of the inner side of the heat dissipation film in contact with the second portion 12. Since the heat dissipation film 4 closely abuts the inner surface of the bending area 12, i.e. the heat dissipation film 4 is arc-shaped corresponding to the arc segment of the second portion 12 formed by the folding thereof, the pressing block 7 shall have an arc shape corresponding to the arc segment of the second portion 12. The arc shape of the pressing block 7 is particularly suitable for sufficiently and snugly pressing the heat dissipation film 4 onto the second part 12 of the display substrate 1.

The support plate 2 may be formed of a single layer of material. In particular, the support plate 2 may be formed of a single layer of steel plate. Compared with the support plate 2 formed of the double-layers material as shown in FIGS. 1 and 2, the support plate 2 formed of a single layer of material leads to a less thickness of the flexible screen. Of course, it is also possible to use a support plate 2 formed of double-layers steel plates in the flexible screen of the present disclosure.

Various modifications and variations conceivable by those skilled in the art can be made to the embodiments disclosed above without departing from the scope or spirit of the present disclosure. According to the disclosure, other embodiments will be obvious to those skilled in the art. This description and its disclosed examples are to be considered illustrative only, and the protection scope of the present disclosure is to be specified by the appended claims and their equivalents.

What is claimed is:

1. A flexible screen comprising:
a display substrate comprising a first portion, a second portion, and a third portion sequentially connected, the second portion folded to form an end portion of the flexible screen; and
a support plate for supporting the display substrate,
wherein the first portion and the third portion of the display substrate are opposite to each other, the support plate is arranged between the first portion and the third portion of the display substrate, and one end of the support plate faces one surface of the second portion; and
wherein the one surface of the second portion facing the support plate is provided with an end heat dissipation device.

2. The flexible screen according to claim 1, further comprising at least one heat dissipation film provided on a surface of the first portion and/or the third portion facing the support plate.

3. The flexible screen according to claim 2, wherein the end heat dissipation device is a heat dissipation film provided on the one surface of the second portion facing the support plate.

4. The flexible screen according to claim 3, wherein the heat dissipation film on the second portion is smoothly connected to the heat dissipation film(s) on the first portion and/or the third portion.

5. The flexible screen according to claim 4, wherein the heat dissipation film on the second portion and the heat dissipation film(s) on the first portion and/or the third portion are formed of a single material.

6. The flexible screen according to claim 3, further comprising a pressing block that contacts the heat dissipation film at the second part of the display substrate to apply a force to the heat dissipation film at the second part of the display substrate so as to press the heat dissipation film onto the second portion.

7. The flexible screen according to claim 6, wherein the pressing block is fixed on the support plate.

8. The flexible screen according to claim 6, wherein the pressing block is an elastic pressing block.

9. The flexible screen according to claim 3, wherein the heat dissipation film on the second portion and the heat dissipation film(s) on the first portion and/or the third portion are formed of any of the following materials: artificial graphite, natural graphite, graphene, nano-carbon, copper foil, heat-conducting silica gel, and a composite material of the materials selected from: artificial graphite, natural graphite, graphene, nano-carbon, copper foil and heat-conducting silica gel.

10. The flexible screen according to claim 1, wherein the first portion is a display area for displaying, and the third portion is a non-display area for carrying electronic components.

11. The flexible screen according to claim 1, wherein the end heat dissipation device is a heat dissipation silica gel.

12. The flexible screen according to claim 11, wherein the heat dissipation silica gel has a shape complementary to that of the one surface of the second portion of the display substrate facing the support plate.

13. The flexible screen according to claim 12, wherein the heat dissipation silica gel contacts the support plate and is pressed by the one end of the support plate to snugly abut the one surface of the second portion of the display substrate.

14. The flexible screen according to claim 1, wherein the end heat dissipation device is a heat dissipation film provided on the one surface of the second portion facing the support plate.

15. The flexible screen according to claim 14, wherein the flexible screen further comprises a pressing block contacting the heat dissipation film at the second portion of the display substrate to apply a force to the heat dissipation film, so as to press the heat dissipation film onto the second portion.

16. The flexible screen according to claim 15, wherein the pressing block is fixed on the support plate.

17. The flexible screen according to claim 15, wherein the pressing block is an elastic pressing block.

18. The flexible screen according to claim 14, wherein the heat dissipation film is formed of the following materials: artificial graphite, natural graphite, graphene, nano-carbon, copper foil, heat-conducting silica gel or a composite of the materials selected from: artificial graphite, natural graphite, graphene, nano-carbon, copper foil and heat-conducting silica gel.

19. The flexible screen according to claim 1, wherein the end heat dissipation device is formed of any of the following materials: artificial graphite, natural graphite, graphene, nano-carbon, copper foil, heat-conducting silica gel, and a composite material of the materials selected from: artificial graphite, natural graphite, graphene, nano-carbon, copper foil and heat-conducting silica gel.

20. The flexible screen according to claim 1, wherein the support plate is a single-layer material plate.

\* \* \* \* \*